(12) United States Patent
Sirrine

(10) Patent No.: US 6,943,560 B1
(45) Date of Patent: Sep. 13, 2005

(54) METHOD TO FACILITATE TESTING OF LASER FUSES

(75) Inventor: Jennifer L. Sirrine, Eagle, ID (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 10/184,419

(22) Filed: Jun. 27, 2002

(51) Int. Cl.[7] ............................................. H01H 85/30
(52) U.S. Cl. ..................................... 324/550; 702/117
(58) Field of Search .......................... 324/550, 537; 365/201; 702/117

(56) References Cited

U.S. PATENT DOCUMENTS 5,677,917 A * 10/1997 Wheelus et al. ............ 714/726
6,157,210 A * 12/2000 Zaveri et al. ............... 365/201
6,263,295 B1 * 7/2001 Morgan ....................... 324/550
6,614,703 B2 * 9/2003 Pitts et al. ................... 365/221
2002/0044006 A1 * 4/2002 Jung et al. ................... 327/525

OTHER PUBLICATIONS

"IEEE Standard Rest Access Port and Boundary-Scan Architecture", IEEE Std 1149.1-2001 (Revision of IEEE Std 1149.1-1990), pp. 1-200.

* cited by examiner

Primary Examiner—Anjan Deb
Assistant Examiner—Timothy J. Dole
(74) Attorney, Agent, or Firm—Christopher P. Maiorana, PC

(57) ABSTRACT

A method of testing a circuit having a plurality of one-time programmable cells. The method generally comprises the steps of (A) transmitting a plurality of addresses to the circuit and (B) receiving a plurality of values from the circuit each representing at least one of the one-time programmable cells in response to one of the addresses.

13 Claims, 7 Drawing Sheets

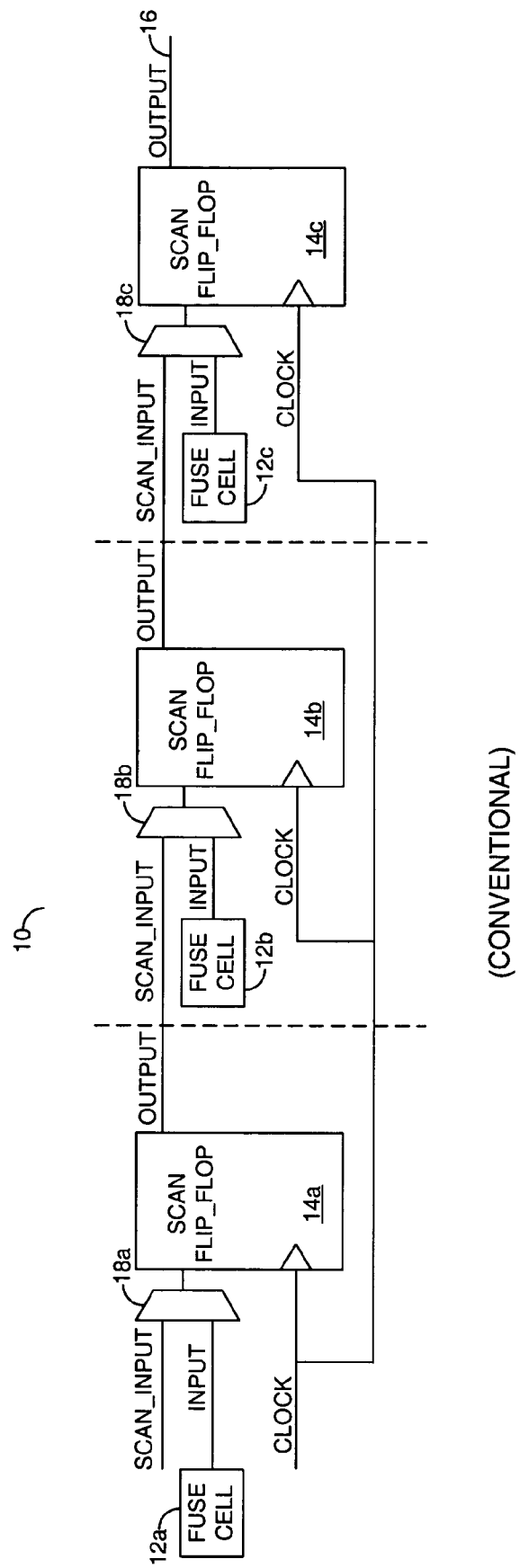
FIG. 1
(CONVENTIONAL)

METHOD TO FACILITATE TESTING OF LASER FUSES

FIELD OF THE INVENTION

The present invention relates to a method and/or architecture for testing one-time programmable cells generally and, more particularly, to testing laser-activated fuses independent of a test scan chain.

BACKGROUND OF THE INVENTION

Referring to FIG. 1, a block diagram of a conventional arrangement 10 for testing fusible cells is shown. Each fuse cell 12a–c is associated with a scan flip-flop 14a–c within a test scan chain 16. Multiplexers 18a–c are provided to present values of the respective fuse cells 12a–c into the respective flip-flops 14a–c. The fuse cell values are then read in serial fashion through the test scan chain 16 by clocking the flip-flops 14a–c with a clock signal (i.e., CLOCK).

In the past there have been problems with using laser-activated fuses using the conventional arrangement 10. One problem is that the fuse cells 12a–c alter a scan test methodology. Programming different values into the fuse cells 12a–c for different parts cause different captured outputs. Therefore, a custom set of scan test vectors must be created and maintained for each programming pattern of the fuse cells 12a–c. The multiple sets of test vectors reduce an efficiency of a test engineer as well as a tester itself. Furthermore, generation of the multiple vector sets adds complexity as compared to a single set. Alternatively, if the flip-flops 14a–c are not inserted onto the test scan chain 16, there has been no way to read or test the programmed fuse cells 12a–c.

Another conventional technology is to use a read-only memory (ROM) cell to replace the functionality of the fuse cells 12a–c. However, the ROM cell approach does not allow for customization among parts based on a common design. Each unique ROM cell program requires a unique fabrication mask. The idea with the laser-activated fuses is that within one mask set, there could be different values in the fuse cells 12a–c.

SUMMARY OF THE INVENTION

The present invention concerns a method of testing a circuit having a plurality of one-time programmable cells. The method generally comprises the steps of (A) transmitting a plurality of addresses to the circuit and (B) receiving a plurality of values from the circuit each representing at least one of the one-time programmable cells in response to one of the addresses.

The objects, features and advantages of the present invention include providing a method and/or architecture for testing one-time programmable cells that may provide for (i) a simple way for one-time programmable cells to be used as customizable static data storage cells, (ii) testing programs written into one-time programmable cells independent of a test scan, (iii) testing one-time programmable cells without hindering scan test methodology, (iv) increasing an efficiency of a tester, (v) increasing an efficiency for a test engineer, (vi) reducing a cost of developing parts from a common design, (vii) reducing a complexity of developing parts from a common design, and/or (viii) reading fuse values in a test or a manufacturing mode.

BRIEF DESCRIPTION OF THE DRAWINGS

These and other objects, features and advantages of the present invention will be apparent from the following detailed description and the appended claims and drawings in which:

FIG. 1 a block diagram of a conventional arrangement for testing fusible cells;

DETAILED DESCRIPTION OF THE PREFERRED EMBODIMENTS

The present invention generally isolates one-time programmable cells from a test scan chain, while still maintaining testability and visibility of the one-time programmable cells. The testability and visibility may be maintained through a memory-mapped interface to a block of the one-time programmable cells. The memory-mapped interface generally allows the one-time programmable cells to be tested by "reading" the one-time programmable cells. Reading generally involves presenting a correct address on an address bus. Data that may be programmed or stored in the one-time programmable cells at the address may then be presented on a data bus. A tester may then compare the read data values with the programmed values that should be contained in the one-time programmable cells. The approach generally maintains testability and visibility of the one-time programmable cells and may eliminate a need for conventional fuse cell flip-flops to be on a conventional scan chain.

Figure 2:
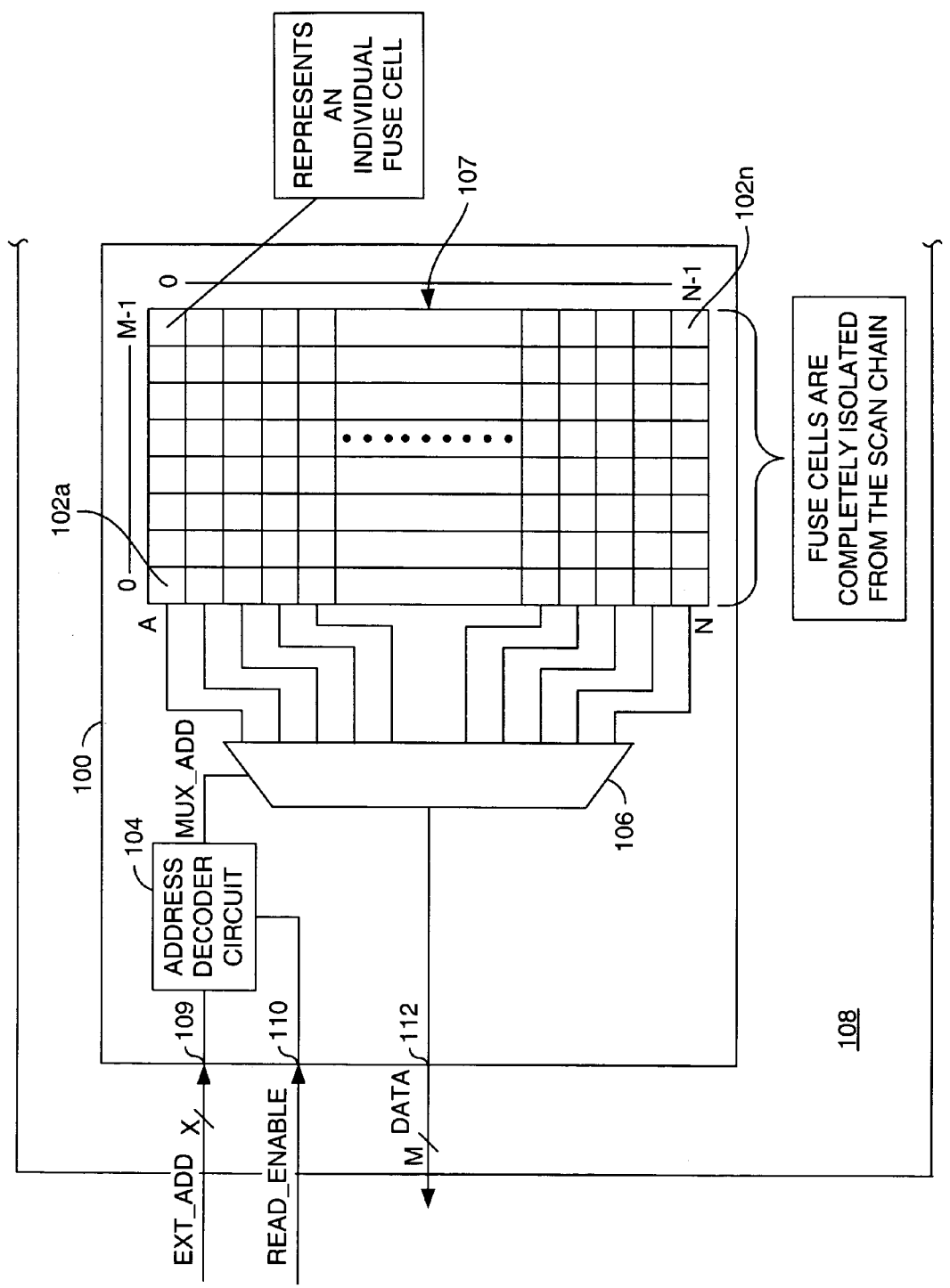
FIG. 2 is a block diagram of an example circuit in accordance with a preferred embodiment of the present invention.

Referring to FIG. 2, a block diagram of an example device or circuit 100 is shown in accordance with a preferred embodiment of the present invention. The circuit 100 generally comprises multiple one-time programmable cells 102a–x, a circuit 104 and a multiplexer circuit 106. The one-time programmable cells 102a–x may be considered as an M column by N row array 107. The circuit 100 may be implemented on an integrated circuit or chip 108.

An input 109 of the circuit 100 may receive a signal (e.g., EXT_ADD). Another input 110 of the circuit 100 may receive another signal (e.g., READ_ENABLE). The circuit 100 may include an output 112 to present a signal (e.g., DATA). The interfaces 109, 110, and 112 may be configured as a memory-like interface to allow for testability and visibility into the circuit 100.

The circuit 104 may receive the signal EXT_ADD. The circuit 104 may also receive the signal READ_ENABLE. A signal (e.g., MUX_ADD) may be generated and presented by the circuit 104 to the multiplexer circuit 106. Multiple signals (e.g., A–N) may be generated and presented by the one-time programmable cells 102a–x to the multiplexer circuit 106. The multiplexer circuit 106 may generate and present the signal DATA at the output 112.

Figure 5:
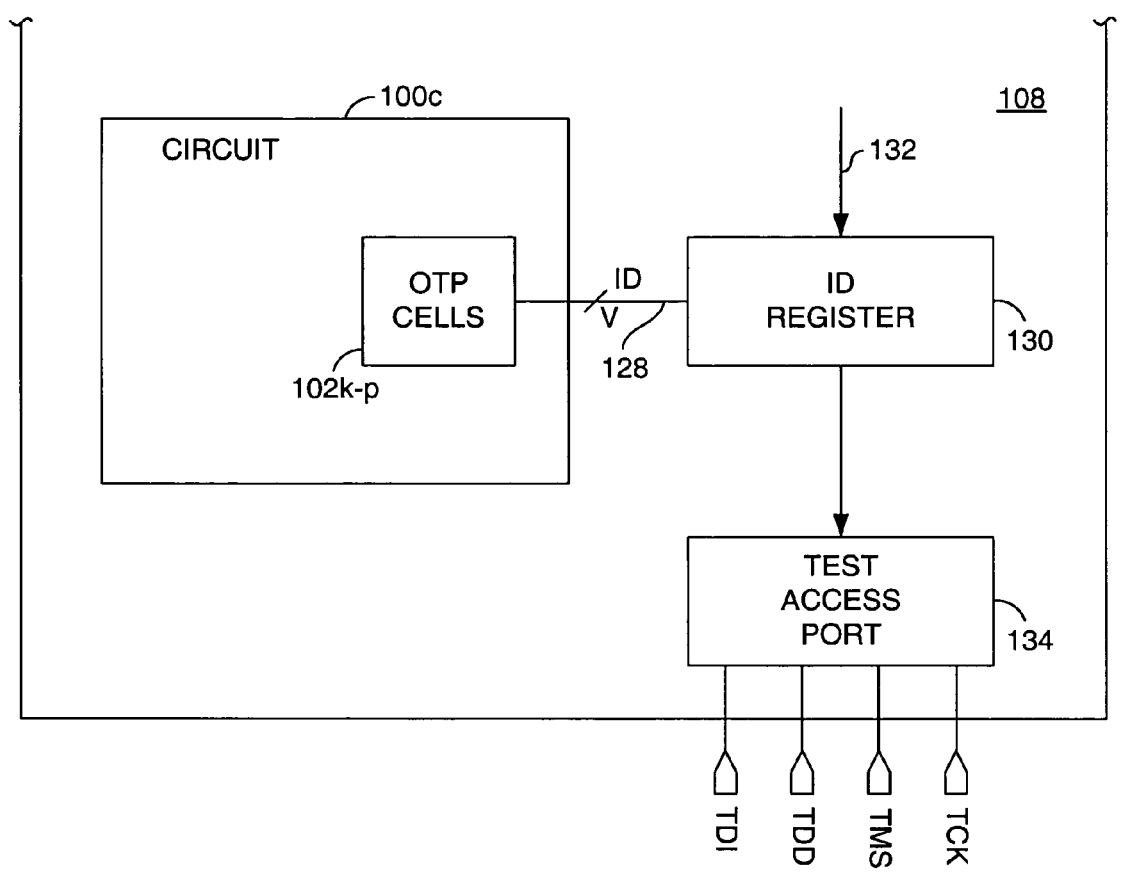
FIG. 5 is a partial block diagram of a fourth embodiment of the circuit.

Each one-time programmable cell 102a–x may be fabricated having a first state and may be programmable into a second state. The one-time programmable cells 102a–x may be implemented as, but are not limited to fuse cells, antifuse cells, laser-activated cells (e.g., ablated or annealed), thermally programmable cells, or the like. Programming of the one-time programmable cells 102a–x generally involves changing an impedance of the cells 102a–x. Some types of one-time programmable cells 102a–x may change from a low impedance to a high impedance while other types of one-time programmable cells 102a–x may change from the high impedance to the low impedance. Each one-time programmable cell 102a–x may include additional circuitry (not shown) that may allow the cell 102a–x to present a programmed value as a voltage or a current. The fuse block array 107 may be collared or isolated from the scan chain (FIG. 5). Therefore, values read from the scan chain may be independent of the fuse values stored in the fuse block array 107.

The circuit 104 may be implemented as an address decoder circuit. The address decoder circuit 104 generally translates the signal EXT_ADD into the signal MUX_ADD. The translation may compress, shift and/or expand an address range received through the signal EXT_ADD into the signal MUX_ADD. Translation of the signal EXT_ADD may be dependent upon the signal READ_ENABLE. While the signal READ_ENABLE may be in an asserted state, the address decoder circuit 104 may generate the signal MUX_ADD based upon the signal EXT_ADD. While the signal READ_ENABLE may be in a de-asserted state, the address decoder circuit 104 may generate the signal MUX_ADD with a default address.

The multiplexer circuit 106 may be implemented as an M-bit wide/input by N or N+1 input multiplexer. The M-bit width may match the M columns of the array 107. The N inputs may match the N rows of the array 107. The extra input may be for a default value. The multiplexer circuit 106 may multiplex the signals A–N to generate the signal DATA as controlled by the signal MUX_ADD. The multiplexer circuit 106 may also generate the signal DATA with a predetermined null value while receiving the signal MUX_ADD with the default address.

The signal EXT_ADD may be implemented as an address signal generated external to the chip 108. The signal EXT_ADD may have an address range greater than or equal to the N rows of the array 107. The signal EXT_ADD may include an offset such that a lowest address carried by the signal EXT_ADD may not have a zero value.

The signal READ_ENABLE may be implemented as a read enable signal generated external to the chip 108. The signal READ_ENABLE may have an asserted state to enable reading from the array 107 via the signal EXT_ADD. The signal READ_ENABLE may have a de-asserted state to disable reading from the array 107 via the signal EXT_ADD.

The signal DATA may be implemented as a data signal transferring information regarding the one-time programmable cells 102a–x. The signal DATA may be available external to the chip 108. The signal DATA may have a width of M-bits that correspond to the M columns of the array 107. Each bit of the signal DATA may represent a single value or state programmed into a one-time programmable cell 102a–x within a row of the array 107 determined by the signal EXT_ADD.

The signal MUX_ADD may be implemented as an address signal that controls the multiplexer circuit 106. The signal MUX_ADD may have an address range equal to or slightly larger than a number of inputs to the multiplexer circuit 106. Each address conveyed by the signal MUX_ADD may be uniquely associated with one of the N-rows of the array 107.

Each signal A–N may be implemented as a data signal. Each signal A–N may have a width of M-bits that correspond to the M columns of the array 107. The signal A may be generated and presented by the Ath row of the array 107. The signal N may be generated and presented by the Nth row of the array 107. Each of the M bits may transfer a value from one of the one-time programmable cells 102a–x in the respective row.

Operationally, the circuit 100 may respond to the signals READ_ENABLE and EXT_ADD by generating the signal MUX_ADD. The multiplexer circuit 106 generally multiplexes one of the signals A–N as determined by the signal MUX_ADD to the signal DATA. The signal DATA may then be read external to the circuit 100 to determine the values programmed into the one-time programmable cells 102a–x in the requested row of the array 107. The read values conveyed by the signal DATA may then be used to verify the states of the one-time programmable cells 102a–x.

Figure 3:
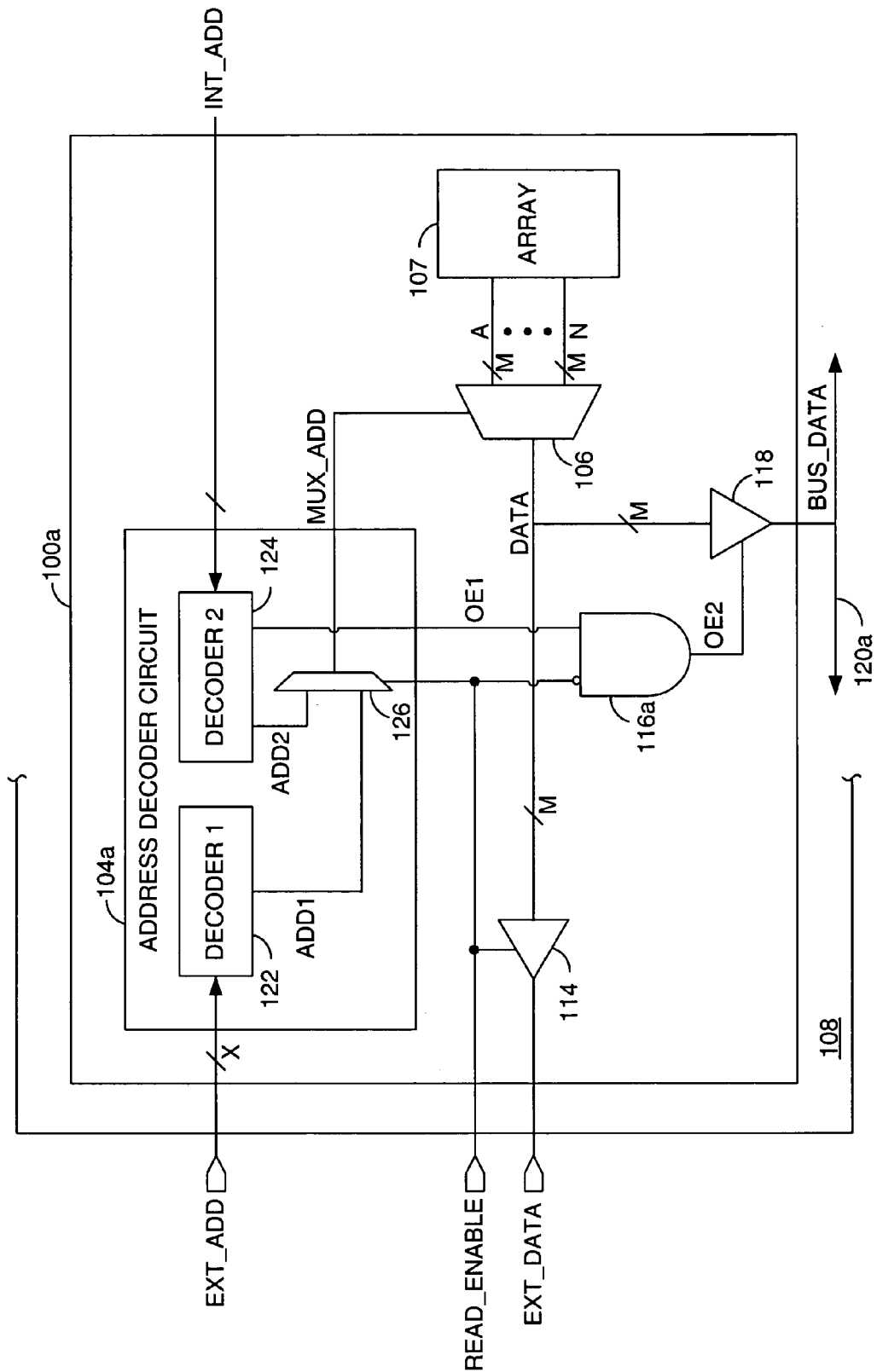
FIG. 3 is a block diagram of a second example embodiment of the circuit.

Referring to FIG. 3, a block diagram of a second example embodiment of the circuit 100 is shown. A circuit 100a generally comprises an address decoder circuit 104a, the multiplexer circuit 106, and the array 107 on the chip 108 connected by the signals EXT_ADD and MUX_ADD as shown in FIG. 2. Furthermore, the circuit 100a may also comprise an optional driver or buffer 114, an optional logic gate 116a, and another driver or buffer 118.

The signal DATA may be provided to an input of the buffer 114. In turn, the buffer 114 may generate and present a signal (e.g., EXT_DATA) external to the chip 108. The signal READ_ENABLE may also be received by the buffer 114 to control generation of the signal EXT_DATA. While the signal READ_ENABLE may be in the asserted state, the buffer 114 may present the signal EXT_DATA equal to the signal DATA. While the signal READ_ENABLE may be in the de-asserted state, the buffer 114 may present a high impedance. The buffer 114 may be eliminated from the circuit 100a such that the signal DATA may be always available outside the chip 108.

The address decoder circuit 104a may receive a signal (e.g., INT_ADD). A signal (e.g., OE1) may be generated and presented by the address decoder circuit 104a. The signal OE1 may have the asserted state while the signal INT_ADD conveys an address within an address range allocated to the array 107. The signal OE1 may have the de-asserted state while the signal INT_ADD conveys an address outside the address range allocated to the array 107.

The signal OE1 may be received at a non-inverting input of the logic gate 116a. An inverting input of the logic gate 116a may receive the signal READ_ENABLE. The logic gate 116a may generate and present a signal (e.g., OE2) in the asserted state while the signal READ_ENABLE may be de-asserted and the signal OE1 may be asserted. Otherwise, the signal OE2 may be in the de-asserted state. The logic gate 116a may be eliminated where the signals EXT_ADD and INT_ADD may be guaranteed to be mutually exclusive in accessing the array 107.

The buffer 118 may receive the signal DATA from the multiplexer circuit 106. The buffer 118 may generate and present a signal (e.g., BUS_DATA). The buffer 118 may receive the signal OE2 to control generation of the signal BUS_DATA. While the signal OE2 may be asserted, the buffer 118 may present the signal BUS_DATA equal to the signal DATA to an internal bus 120a. While the signal OE2 may be de-asserted, the buffer 118 may present a high impedance to the internal bus 120a.

The address decoder circuit 104a generally comprises a first decoder circuit 122, a second decoder circuit 124 and a multiplexer circuit 126. The first decoder circuit 122 may decode the signal EXT_ADD to generate an address signal (e.g., ADD1). The second decoder circuit 124 may decode the signal INT_ADD to generate another address signal (e.g., ADD2). The multiplexer circuit 126 may multiplex the signals ADD1 and ADD2 to the signal MUX_ADD as controlled by the signal READ_ENABLE.

While the signal READ_ENABLE may be asserted, the multiplexer circuit 126 may route the decoded address signal ADD1 to the signal MUX_ADD. The multiplexer circuit 106 may route the data from the addressed row of the array 107 to the signal DATA. The buffer 114 may then present the values external to the circuit 100a.

While the signal READ_ENABLE may be de-asserted, the multiplexer circuit 126 may route the signal ADD2 to the signal MUX_ADD. If the signal INT_ADD is generally within an addressable range for the array 107, the address decoder circuit 104a may assert the signal OE1 and generate an appropriate address in the signal MUX_ADD. The multiplexer 106 may present the requested values from the one-time programmable cells 102a–x in the signal DATA. Concurrently, the logic gate 116a may assert the signal OE2 to the buffer 118. The buffer 118 may thus present the values in the signal DATA to the internal bus 120a within the signal BUS_DATA. Therefore, the array 107 may be configured to behave as a one-time programmable ROM.

Figure 4:
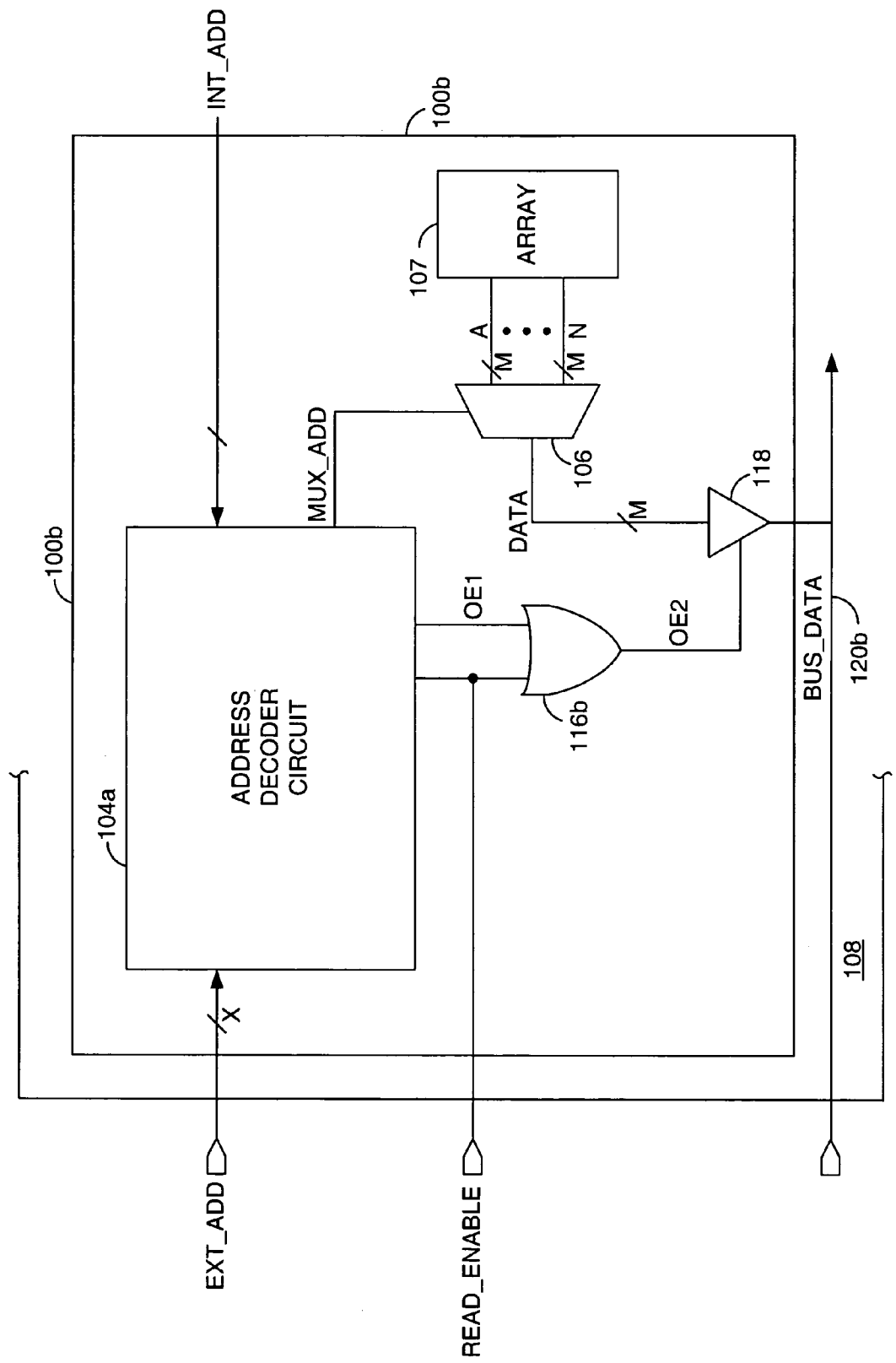
FIG. 4 is a block diagram of a third example embodiment of the circuit.

Referring to FIG. 4, a block diagram of a third example embodiment of the circuit 100 is shown. A circuit 100b generally comprises the address decoder 104a, the multiplexer circuit 106, the array 107, and the buffer 118 on the chip 108 connected by the signals EXT_ADD, INT_ADD, MUX_ADD, DATA, OE1, and OE2 as shown in FIG. 3. In addition, the circuit 100a may include a logic gate 116b. The logic circuit 116b may be implemented as a logical OR gate that receives the signals READ_ENABLE and OE1 to generate the signal OE2. The buffer 118 may present signal BUS_DATA to a bus 120b. The bus 120b may be implemented as an output bus or a bi-directional input/output bus. The bus 120b may be routed external to the chip 108 to make the signal BUS_DATA available for operational and testing purposes.

While the signal READ_ENABLE may be in the asserted state, the logic gate 116b may assert the signal OE2. The asserted signal OE2 may cause the buffer 118 to present the signal DATA from the multiplexer circuit 106 on the bus 120b as the signal BUS_DATA. The signal BUS_DATA may then be available external to the chip 108.

While the signal READ_ENABLE may be in the de-asserted state, the logic gate 116b may assert or de-assert the signal OE2 in response to the signal OE1. While the signal OE1 may be in the de-asserted state, the buffer 118 may present a high impedance to the bus 120b. While the signal OE1 may be asserted, the signal OE2 may be asserted and the buffer 118 may drive the signal DATA onto the bus 120b.

The circuit 100b may be used in situations where the chip 108 is generally input/output limited. By sharing the bus 120b between operational and testing purposes, the chip 108 may not require dedicated outputs to present the values in the signal DATA during testing. Control of the bus 120b for operational or testing use may be determined by the signal READ_ENABLE. Likewise, the signal EXT_ADD may be shared on another input or input/output bus (not shown) to further reduce the I/O pin count for the chip 108. Other designs may be implemented for getting the signals EXT_ADD and DATA on and off the chip 108 to meet the design criteria of a particular application.

Referring to FIG. 5, a partial block diagram of a fourth embodiment of the circuit 100 is shown. A circuit 100c may include a connection 128 between one or more of the one-time programmable cells 102a–x and an identification register 130 of a test scan chain 132. Generally, the circuits 100, 100a, and 100b are isolated and independent of any test scan chain, such as test scan chain 132. However, in some designs such as the circuit 100c, some of the one-time programmable cells 102a–x may be used to program information that may be accessible through the test scan chain.

The test scan chain 132 and the identification register 130 may be defined by the Joint Test Action Group (JTAG) architecture for scan chains. The architecture may be defined by The Institute of Electrical and Electronics Engineering (IEEE) Standard 1149.1-1990, titled "IEEE Standard Test Access Port and Boundary-Scan Architecture", published by the IEEE, New York, N.Y., hereby incorporated by reference in its entirety. The IEEE 1149.1-2001 standard may specify the identification register 130 as storing a version number, a part number and a manufacturer identification. Other test scan chain architectures and specifications may be implemented to meet the design criteria of a particular application.

A predetermined number (e.g., V) of predetermined one-time programmable cells 102k–p may be programmed to store some or all of a vendor identification value, part identification value, version identification value, serial number, and/or the like. The connection 128 may transfer the programmed identification information as a signal (e.g., ID) to the identification register 130. From the identification register 130, the programmed information in the signal ID may be transferred across the test scan chain 132 to a test access port 134 and then external to the chip 108. The test access port 134 may interface external to the chip 108 by a test data input signal (e.g., TDI), a test data output signal (e.g., TDO), a test clock signal (e.g., TCK), and a test mode signal (e.g., TMS). As such, the values programmed into the signal ID may be readable from the chip 108 via the test scan chain 132 and the through the circuit 10c in the signal DATA.

Figure 6:
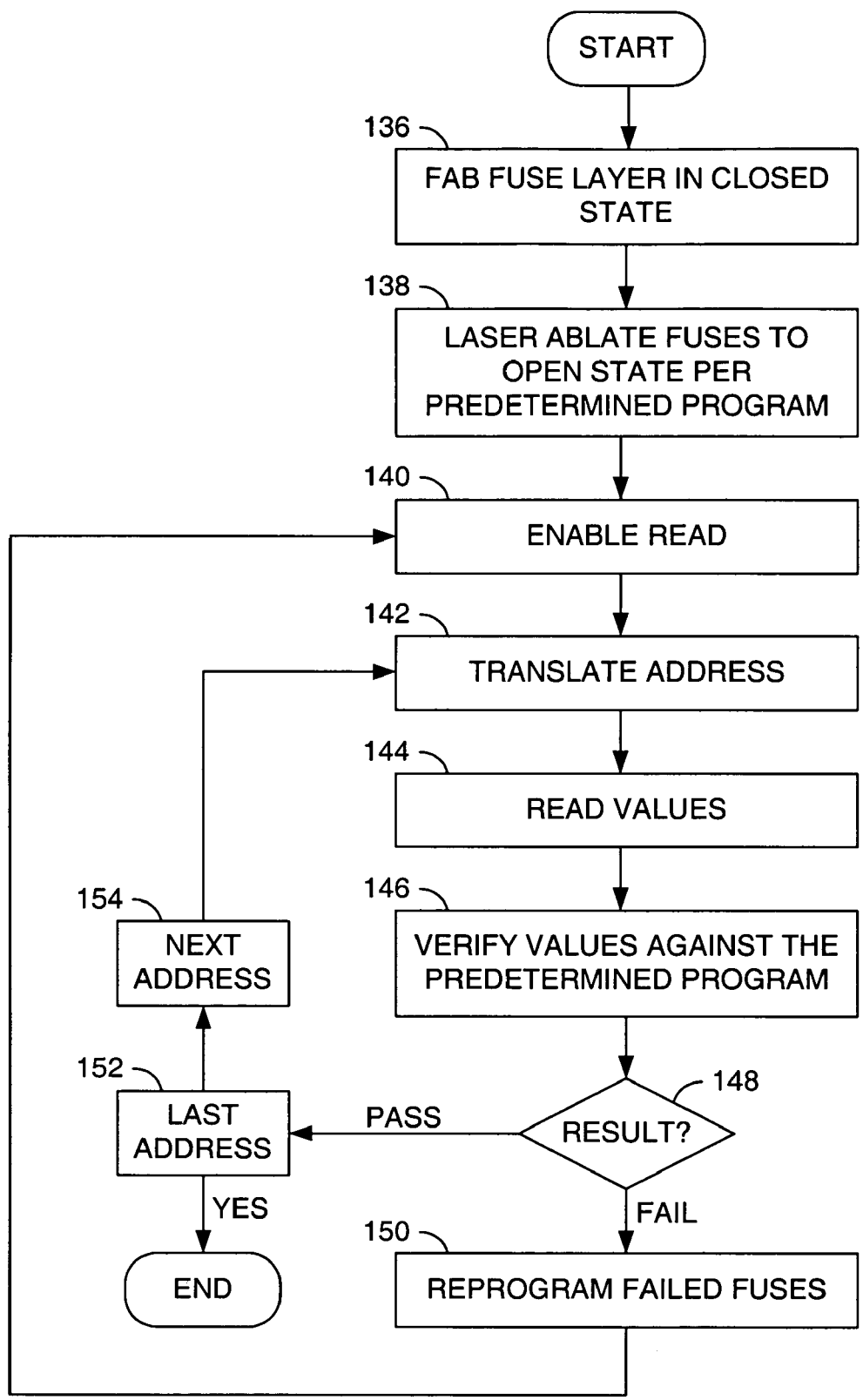
FIG. 6 is a flow diagram of a method of producing the circuit.

Referring to FIG. 6, a flow diagram of a method of producing the circuit 100 is shown. The method may follow conventional fabrication techniques up to and including a step of fabricating a fuse layer for the one-time programmable cells 102a–x (e.g., block 136). For designs using laser-ablated fuses in the one-time programmable cells 102a–x, the fuse layer may default all of the one-time programmable or fuse cells 102a–x to a closed state. Laser light may then be used to program one or more of the fuse cells 102a–x to an open state (e.g., block 138).

Once the chip 108 has been connected to power, ground and I/O signals have been connected to a tester, a read from the array 107 may be enabled (e.g., block 140) by asserting the signal READ_ENABLE and providing an appropriate value in the signal EXT_ADD. The address decoder 104 may then convert the signal EXT_ADD into the signal MUX_ADD (e.g., block 142). The multiplexer circuit 106 may respond to the signal MUX_ADD by presenting the signal DATA (e.g., block 144). The tester and/or a human may then check the values in the signal DATA to verify programming of the fuse cells 102a–x (e.g., block 146).

If a result of the verification indicates a failure (e.g., the FAIL branch of decision block 148), the failed fuse cell or fuse cells 102a–x may be reprogrammed with the laser light (e.g., block 150). The process may then repeat from enabling reading from the array 107 (e.g., block 140) through verification (e.g., block 146). Reprogramming and re-verification may be repeated multiple times if necessary or desired.

If the result of the verification indicates a success (e.g., the PASS branch of decision block 148), the tester may check to see if the last address for the particular test sequence has been reached in signal EXT_ADD (e.g., decision block 152). If the last address has not been reached (e.g., the NO branch of decision block 152), the address within the signal EXT_ADD may be incremented or changed (e.g., block 154). Testing may then continue with the address decoder circuit 104 translating the new signal EXT_ADD (e.g., block 142). The address values in the signal EXT_ADD may be repeatedly changed in block 154 until the last tested address has been reached (e.g., the YES branch of decision block 152). Thereafter the test sequence may end.

Figure 7:
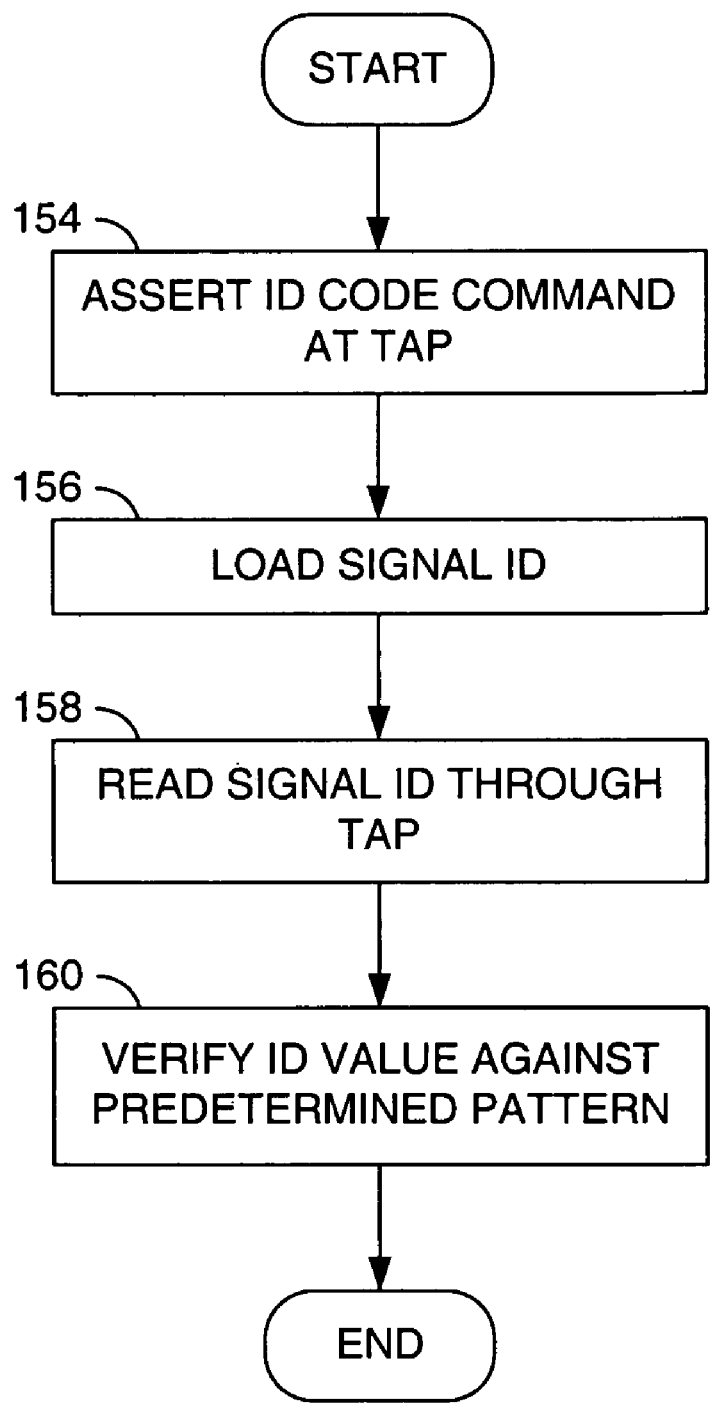
FIG. 7 is a flow diagram of a method for testing a programmed identification value through a test scan chain.

Referring to FIG. 7, a flow diagram of a method for testing a programmed identification value through the test scan chain 132 is shown. After the appropriate one-time programmable cells 102k–p have been written, the test may begin by asserting an identification code command to the test access port 134 (e.g., block 154). The test access port 134 may respond to the command by instructing the identification register 130 to load the signal ID in parallel (e.g., block 156). The value from the signal ID may then be serially clocked out of the test scan chain 132 and the test access port 134 (e.g., block 158). Finally, the tester and/or human may check the identification value to verify proper programming of the appropriate one-time programmable cells 102k–p (e.g., block 160).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. A method of operating a circuit having a plurality of one-time programmable cells, comprising the steps of:
    (A) generating a multiplex address signal by decoding an external address signal;
    (B) generating a value by multiplexing a plurality of signals from said one-time programmable cells as controlled by said multiplex address signal; and
    (C) transmitting said value external to said circuit, wherein the step of generating said multiplex address signal comprises the sub-steps of:
        generating a first signal by decoding said external address signal;
        generating a second signal by decoding an internal address signal; and
        generating said multiplex address signal as one of said first signal and said second signal.

2. The method according to claim 1, further comprising the step of enabling said transmitting step in response to an external enable signal.

3. The method according to claim 1, further comprising the step of driving said value onto a bus connected to said circuit in response to said internal address signal being within a predetermined address range.

4. The method according to claim 1, wherein the step of generating said multiplex address signal as one of said first signal and said second signal is controlled by an external enable signal.

5. The method according to claim 1, further comprising the step of driving said value onto a bus connected to said circuit in response to an external enable signal.

6. The method according to claim 5, wherein said step (C) comprises the sub-step of conveying said value via said bus.

7. A method of producing a circuit having a plurality of one-time programmable cells, comprising the steps of:
    (A) fabricating each of said one-time programmable cells in a first state;
    (B) programming at least one of said one-time programmable cells to a second state;
    (C) reading a first plurality of states for said one-time programmable cells at a first address of plurality of addresses; and
    (D) reading a second plurality of states for said one-time programmable cells at a second address of said addresses to verify said programming step.

8. The method according to claim 7, wherein said step (B) comprises the sub-step of ablating to program.

9. The method according to claim 7, wherein each of said one-time programmable cells is a laser-activated fuse.

10. The method according to claim 7, wherein said step (C) is performed independent of a test scan chain.

11. The method according to claim 7, wherein said one-time programmable cells are configured as a read-only memory comprising an address interface, an enable interface and a data interface.

12. The method according to claim 7, further comprising the step of reading a value of at least one of said one-time programmable cells through a test scan chain connected to said circuit.

13. The method according to claim 12, wherein said value determines an identification value specified for said test scan chain.

* * * * *